United States Patent [19]

Taylor

[11] Patent Number: 5,006,735
[45] Date of Patent: Apr. 9, 1991

[54] METHOD AND APPARATUS FOR COMPENSATING A SOLID STATE ATTENUATOR

[75] Inventor: Stewart S. Taylor, Beaverton, Oreg.

[73] Assignee: TriQuint Semiconductor, Inc., Beaverton, Oreg.

[21] Appl. No.: 468,508

[22] Filed: Jan. 23, 1990

[51] Int. Cl.$^5$ .......................... H03K 5/08; H01P 1/22
[52] U.S. Cl. ..................................... 307/568; 307/264; 333/81 R
[58] Field of Search .............. 307/540, 552, 555, 557, 307/558, 568, 264; 333/81 R

[56] References Cited

U.S. PATENT DOCUMENTS

| 4,366,396 | 12/1982 | Rösler et al. | 307/555 |
| 4,468,607 | 8/1984 | Tanaka et al. | 333/81 R |
| 4,523,161 | 6/1985 | Miles | 307/568 |

FOREIGN PATENT DOCUMENTS 0165420 7/1987 Japan ................... 333/81 R

Primary Examiner—John Zazworsky
Attorney, Agent, or Firm—Alan T. McCollom; Peter J. Meza

[57] ABSTRACT

A binarily weighted FET attenuator implemented in integrated form. The resistance of the vertical branches to the horizontal branches is at a ratio of 2:1. Each vertical branch includes a FET switch for switching between ground and a summing amplifier and each horizontal branch includes a FET permanently biased to conduct. Thus, variations in the value of $r_{on}$, the resistance of each FET when conducting, due to fabrication process and temperature are compensated for due to the presence of FETs in both the vertical and horizontal legs of the attenuator.

23 Claims, 3 Drawing Sheets

METHOD AND APPARATUS FOR COMPENSATING A SOLID STATE ATTENUATOR

BACKGROUND OF THE INVENTION

1. Field of the Invention

The present invention relates to methods and apparatus for compensating a solid state attenuator and more particularly to such methods and apparatus for compensating attenuators which incorporate resistive ladders in which selected legs of the ladder have preselected resistance values.

2. Description of the Related Art

In one type of prior art binarily weighted attenuator, an attenuator of the type known as an R-2R ladder is utilized in a fashion similar to a digital-to-analog converter. Such an attenuator is illustrated generally at 10 in FIG. 1 and includes therein a number of vertical branches, one of which is indicated generally at 12. Vertical branch 12 includes therein a resistor 14 having a value 2R. Commonly, such a resistor is made of NiCr and comprises two resistors in series, each having a value R. Vertical branch 12 further includes FETs 16, 18 with FET 16 having a source grounded as shown and FET 18 having a source connected to the input of a summing amplifier 20.

Attenuator 10 further includes a plurality of horizontal branches, one of which is indicated generally at 22. Included therein is a resistor 24 having a value R. As can be seen, there are a plurality of vertical branches, like branch 12, which are substantially identical to one another as well as a plurality of substantially identical horizontal branches, like branch 22, which connect the upper ends of adjacent pairs of vertical branches. A horizontal branch 25 includes therein a resistor 27, such having a resistance R. A termination branch 29 includes therein a resistor 31 also having a resistance R.

In operation, a selected bit value, which can assume one of two states, is associated with each vertical branch in attenuator 10. Conventional drive circuitry 11 switches adjacent switching devices responsive to the value of corresponding bits in a digital word. FETs 16, 18 in branch 12 are driven by conventional circuitry, drive circuits 11, complementary to one another and in response to the value of the bit associated with branch 12. In other words when the value of the bit associated with branch 12 is in one state, FET 16 is on and FET 18 is cut off. When the value of the bit is in its other state, FET 18 is on and FET 16 is cut off.

Current flowing in attenuator 10, in response to an input voltage applied to terminal $V_i$, is split in halves at each 2R-R juncture as illustrated in FIG. 1. It can thus be seen that summing amplifier 20 produces a voltage at output terminal $V_o$ thereof which is attenuated by an amount related to the bit values associated with each of the vertical branches, like branch 12, in attenuator 10.

If it is assumed that the FETs in attenuator 10 have no resistance when biased to their conducting condition, the attenuator evenly splits the current at each juncture of a vertical and horizontal branch. Resistor 31 properly terminates the ladder in a conventional way by providing a total resistance of 2R in horizontal branch 25 and termination branch 29. Thus, ½ of the current flows into horizontal branch 25 and ½ into its related vertical branch, again assuming no FET resistance.

The prior art circuit of FIG. 1 suffers from several disadvantages. First, each FET has a finite resistance when biased into a conducting condition, thus increasing the value of the resistance in each vertical leg to something above 2R. It can be seen that in order to evenly split the current at the juncture of each vertical and horizontal branch, the total resistance presented by the circuit for each path must be equal. Because each FET, like FET 16, 18, presents a finite resistance when the FET is on, and one of the FETs is always on, the value of 2R may be slightly reduced in an effort to provide a total resistance for each vertical branch equal to 2R. This approach does not solve the problem, however, because the value of the resistance of each FET when conducting varies as a function of ambient temperature and of the particular process by which the FET was fabricated.

The tendency of the resistance of each FET when on to vary as a function of temperature and process contributes to differential errors, i.e., those which prevent the current from being evenly split at the juncture of each vertical and horizontal branch. This tendency also contributes to absolute errors, which affect the value of the impedance at the input of the attenuator.

Rather than adjusting the value of 2R in each vertical leg, the FETs can be made large so that the resistance of each FET while on is negligible. Doing so, however, increases the capacitance of each FET thus causing bandwidth problems at higher frequencies and also takes up a larger chip area.

SUMMARY OF THE INVENTION

A compensated attenuator includes a terminal for applying input voltage thereto. A first branch is electrically connected to the terminal and has a first resistance therein. A second branch is also connected to the terminal and has a second resistance therein. A first solid state switching device is disposed in the first branch for switching current therein between a first path and a second path. The switching device presents a third resistance in series with the first resistance when the attenuator is in operative condition. A second solid state switching device is disposed in the second branch. The second switching device is biased into a conducting condition for passing current therethrough and has a fourth resistance when the attenuator is in operative condition. The third and fourth resistances have the same ratio to one another as the first and second resistances.

The present invention is also implemented in a method.

It is an object of the present invention to provide a method and apparatus for compensating a solid state attenuator which overcomes the above-enumerated disadvantages associated with the prior art.

It is a more specific object of the present invention to provide such a method and apparatus which decreases both absolute and differential accuracy errors in the resistance ratios of the attenuator.

It is another specific object of the present invention to provide such a method and apparatus which compensates for the tendency of solid state switching devices to vary as a function of temperature and the process in which the devices were fabricated.

The foregoing and other objects, features and advantages of the invention will become more readily apparent from the following detailed description of a preferred embodiment which proceeds with reference to the drawings.

DESCRIPTION OF THE PREFERRED EMBODIMENTS

Figure 2:
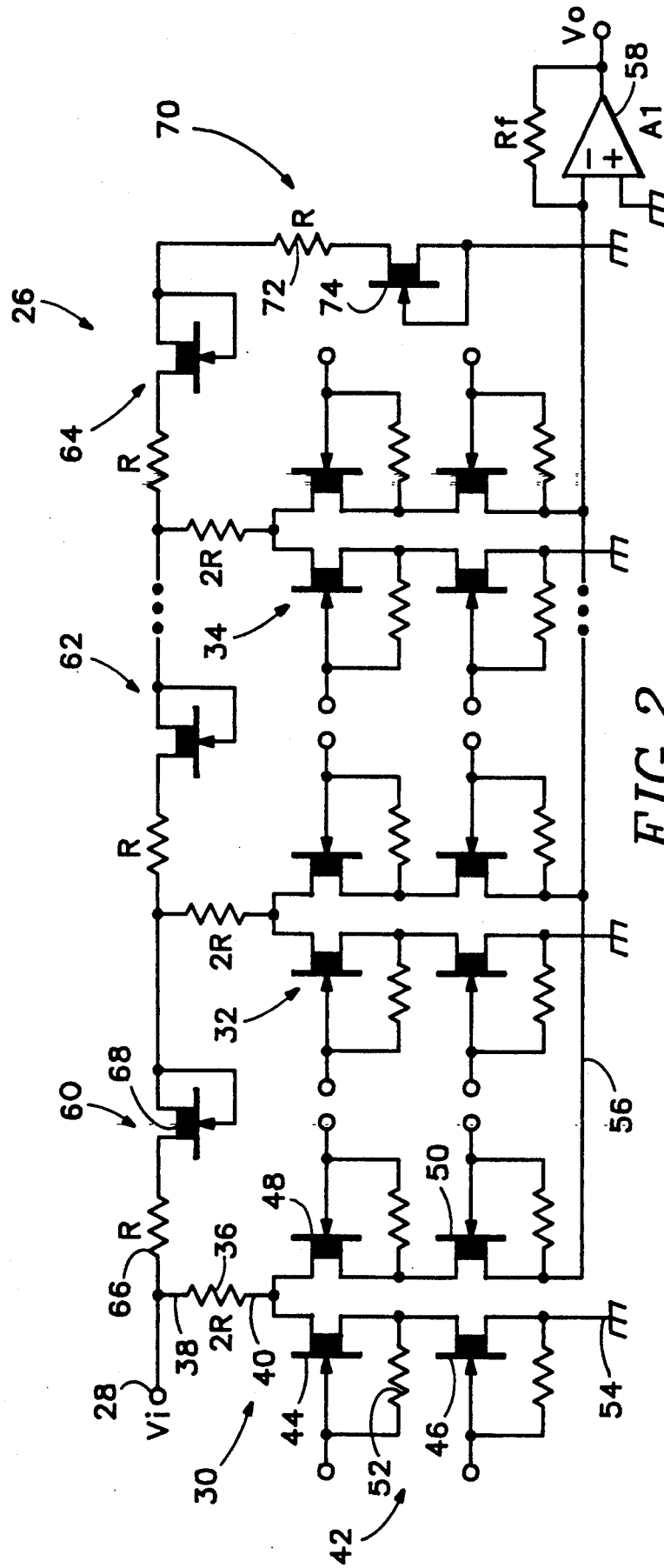
FIG. 2 is a partial schematic diagram of a binarily weighted attenuator constructed in accordance with the present invention.

Indicated generally at 26 in FIG. 2 is a circuit comprising a binarily weighted attenuator constructed in accordance with the present invention. In the present embodiment, circuit 26 is implemented in integrated form using conventional fabrication techniques. Circuit 26 includes an input terminal 28 and a plurality of first or vertical branches indicated generally at 30, 32, 34.

Vertical branch 30 includes therein a first resistor 36 having what is referred to herein as a first resistance. Resistor 36 has a first end 38 and a second end 40. Typically, resistor 36 comprises a pair of precision NiCr resistors, each having a resistance R in series with one another. Resistor 36 thus presents a total resistance of 2R.

Also included in vertical branch 30 is a first solid state switching device indicated generally at 42. Included therein is a first pair of FETs 44, 46 and a second pair of FETs 48, 50. Each of the FETs in circuit 26 is a depletion mode FET. A resistor 52 is disposed between the gate and source of FET 44. Each of the other FETs 44, 48, 50 include a corresponding resistor between the gate and source of each FET.

As will later be explained in more detail, the gates of FETs 44, 46 are driven identically so that each of FETs 44, 46 are either simultaneously conducting or simultaneously cut off. The gates of FETs 48, 50, are also driven identically so that FETs 48, 50 are either always simultaneously conducting or cut off; however, FETs 48, 50 are driven complementary to FETs 44, 46. In other words, whenever FETs 44, 46 are conducting, FETs 48, 50 are cut off and vice versa. In circuit 26, the FETs are cut off by driving the gates of each FET to a sufficiently negative potential. The FETs are biased to conduct by setting the gate-to-source voltage ($V_{GS}$) equal to zero. This is accomplished by conventional control circuitry (not shown), the action of which is described in more detail hereinafter.

When FETs 44, 46 are conducting, current in vertical branch 30 is conducted to a grounded terminal 54. When FETs 48, 50 are conducting, current in branch 30 is supplied to a conductor 56 which is connected to an input terminal of a summing amplifier 58. When FETs 44, 46 are conducting, current in resistor 36 is conducted through a first path to ground terminal 54 and when FETs 48, 50 are conducting, current in resistor 36 is conducted through a second path to the input terminal of summing amplifier 58. Since FETs 44–50 are fabricated in the same process on an integrated circuit chip, the characteristics of the FETs are substantially identical to one another. Thus, when FETs 44, 46 are biased to $V_{GS}=0$, the resistance presented by the FETs is substantially equal to that presented by FETs 48, 50 when they are so biased. Since either FETs 44, 46 or FETs 48, 50 are always conducting when the circuit is in operative condition, switching device 42 presents a substantially constant resistance, equal to the resistance presented by the two conducting FETs, which is referred to herein as a third resistance.

Indicated generally at 60, 62, 64 are second or horizontal branches. A resistor 66 is included in branch 60 and has what is referred to herein as a second resistance. In the present embodiment of the invention this resistance is designated R, such being one-half the value of resistor 36. Also included in horizontal branch 60 is a second solid state switching device or FET 68. As shown in FIG. 2, the gate of FET 68 is connected to the source thereof thus permanently biasing FET 64 so that $V_{GS}=0$ and thereby permanently biasing the FET so that it conducts. When FET 68 is so biased it presents, in series in horizontal branch 60, what is referred to herein as a fourth resistance.

Each of the other vertical branches 32, 34 are substantially identical to vertical branch 30. Similarly, each of the other horizontal branches 62, 64 is substantially identical to horizontal branch 60. Each horizontal branch is connected between the first ends of the first resistors, like branch 60 is connected to end 38 of resistor 36, in each pair of adjacent vertical branches. As will later be more fully explained, each vertical branch is associated with a FET biasing value, which causes either FETs 44, 46 to conduct and FETs 48, 50 to be cut off or vice versa, thus setting the attenuation of circuit 26.

Circuit 26 includes a termination branch indicated generally at 70 which includes therein a resistor 72, having a resistance R, and a FET 74 having the gate thereof tied to the source so that $V_{GS}=0$ when circuit 26 is in operative condition.

Considering now the operation of circuit 26, a signal which is to be attenuated is applied to terminal 28. As will later become apparent, an attenuated version of the same signal is produced at the output of summing amplifier 58 with attenuation being a function of the biasing signals applied to the FETs, like FETs 44–50, in each of the vertical branches, like vertical branches 30–34.

Figure 1:
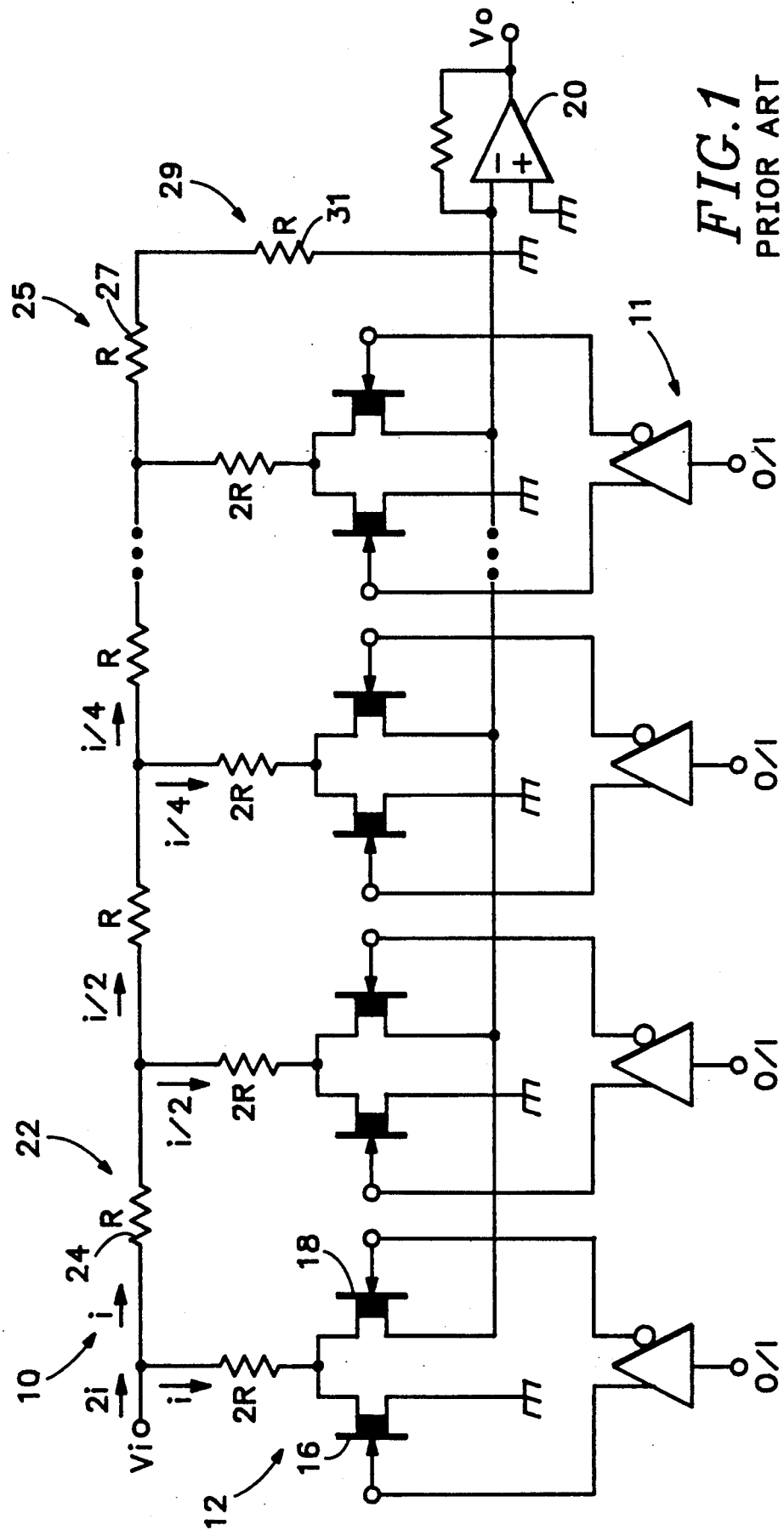
FIG. 1 is a partial schematic diagram of a prior art binarily weighted attenuator.

As previously mentioned herein, conventional control 11 as in FIG. 1 is connected to each of the FETs in each of the vertical branches. Such circuitry drives the FETs in series, like FETs 44, 46, with the same signal so that FETs 44, 46 are always either conducting or nonconducting. A complementary signal drives FETs 48, 50 so that when FETs 44, 46 conduct FETs 48, 50 are cut-off and vice versa. When each of the gates is driven with a sufficiently negative potential, the FET is cut-off. In the circuit 26, the FETs in each vertical branch are made to conduct by setting $V_{GS}=0$.

As will later become more fully apparent, it is important that when FETs 44, 46 or FETs 48, 50 conduct, $V_{GS}$ for the conducting FETs in circuit 26 (including the FETs in the horizontal branches, like FET 68) are equal to one another. In the embodiment of FIG. 2, $V_{GS}$ for FETs 44, 46, when conducting, must equal zero so that each of FETs 44, 46 is biased the same as FET 68. FETs 44, 46, when conducting, thus each present the same resistance as FET 68 since $V_{GS}$ always equals zero for FET 68. Conventional control circuitry for so driving the FETs is known in the art.

Alternatively, the control circuitry for driving the FETs, like FETs 44–50 in each of the vertical branches, like branches 30–34 could drive the gate of each FET negative to cut it off, and could permit each gate to float during periods of FET conduction. So doing prevents current flow in the gate thus causing $V_{GS}$ to equal zero.

A person having ordinary skill in the art could design such a control circuit.

In yet a third alternative, control circuitry could drive each of the gates negatively when the FETs are cut-off i.e., nonconducting, and could be set to drive the FETs to a preselected value other than zero for $V_{GS}$ during conduction. In this alternative FET 68, and each of the other FETs in the horizontal branches, like branches 60-64, would have to be permanently biased to be the value of $V_{GS}$ selected to place the FETs, like FETs 44-50, in the vertical branches in a conducting condition. So doing assures that each FET in a vertical branch of circuit 26, when conducting, has the same resistance as each FET in the horizontal branches of the circuit.

In the circuit of FIG. 2, where $r_{on}$ is equal to the resistance of each FET when $V_{GS}$ equals zero, total resistance in each vertical branch is $2R+2r_{on}$, when circuit 26 operates as described above. In each horizontal branch, the total resistance is $R+r_{on}$. Thus, the ratio of the resistance in each vertical branch to that in each horizontal branch is always 2:1 regardless of fluctuations in temperature. The ratio is substantially maintained regardless of variations in selected FET resistances which result from the fabrication process since each of the FETs in the horizontal as well as vertical branches are fabricated on the same die. The value of $r_{on}$ for each FET in circuit 26 is substantially equal to that value of any other FET in the circuit.

As with each of the other vertical branches, the total resistance in branch 34 is equal to $2R+2r_{on}$. The total value of resistance for horizontal branch 64 plus terminal branch 70 is also equal to $2+2r_{on}$ thus causing the current entering vertical branch 34 and horizontal branch 64 to divide evenly therebetween in the same manner that the current divides at the juncture of each of the other horizontal and vertical branches.

It may be desirable for an impedance of a preselected value to be presented at input terminal 28. This may be desirable when terminating a transmission line and/or to achieve a low voltage standing wave ratio. To provide such an impedance, the value of each resistor R, including the two resistors which make up 2R resistor 36, is each reduced from its ideal value by an amount equal to the nominal value of $r_{on}$ for each FET. Additionally, $R+r_{on}$ is chosen equal to the desired input impedance. The attenuator is thus compensated as just described while at the same time providing a preselected input impedance.

Figure 3:
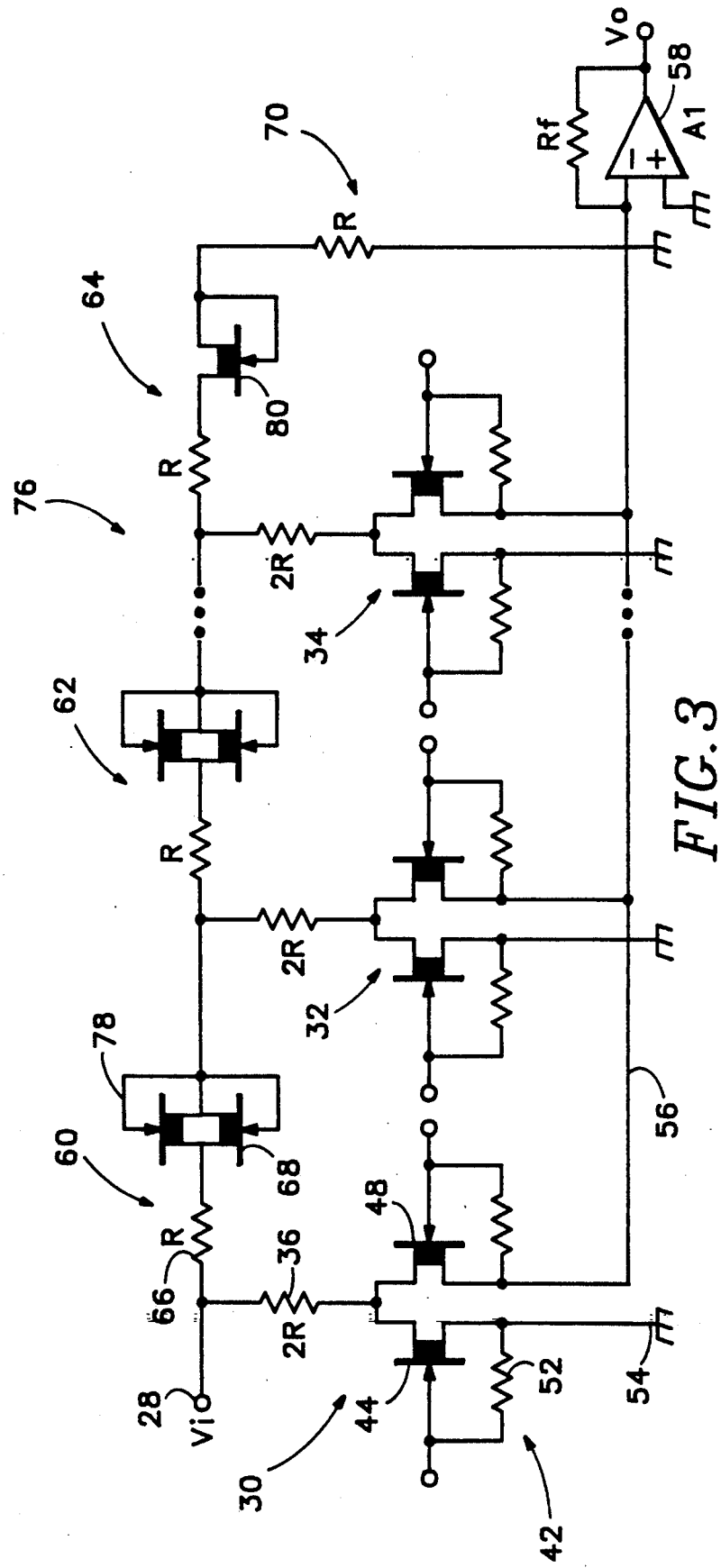
FIG. 3 is a a partial schematic diagram of a second embodiment of a binarily weighted attenuator constructed in accordance with the present invention.

Attention is now directed to FIG. 3 for a slightly modified embodiment of the present invention incorporated in a circuit indicated generally at 76. The structure previously identified and described in connection with circuit 26 in FIG. 2 retains the same numeral in FIG. 3. In FIG. 3 each of the vertical branches, like vertical branches 30-34, contains a first FET 44 and a second FET 48 for switching current in resistor 36 between a first path, to ground terminal 54, and a second path, to conductor 56 and from there to summing amplifier 58. Each of the FETs in the vertical branches include biasing resistors, like resistor 52, disposed between the FET gate and source. Horizontal branch 60 includes a third FET 68 and a fourth FET 78 connected in parallel with one another as shown. Each of the other horizontal branches, except horizontal branch 64, includes similar FETs connected in parallel to one another. Horizontal branch 64 includes a resistor having a resistance R and a single FET 80 while termination branch 70 includes a single resistor having a resistance R.

With ron being the resistance of each FET when $V_{GS}=0$ in circuit 76, the total resistance presented by each vertical branch, like vertical branch 30, is $2R+r_{on}$. The total resistance presented by each horizontal branch, like branches 60, 62, and excepting horizontal branch 64, is $R+\frac{1}{2}(r_{on})$. Thus, the 2:1 ratio between vertical and horizontal branches is maintained in circuit 76 while utilizing fewer FETs, namely two per vertical branch and two per horizontal branch rather than four per vertical branch and one per horizontal branch as in the embodiment of FIG. 2. The resistance of horizontal branch 64 and termination branch 70 combined is $2R+r_{on}$ which is equal to the resistance of vertical branch 34. Current entering the juncture of branches 34, 64 thus divides evenly between the two as is the case with current entering each of the other junctures between horizontal and vertical branches in circuit 76.

The above-described advantages present in connection with circuit 26 in FIG. 2 are thus obtained in circuit 76. An additional advantage is obtained in circuit 76 in that fewer FETs are required to implement the circuit.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A compensated attenuator comprising:
   a terminal for applying an input voltage thereto;
   a first branch electrically connected to said terminal and having a first resistance therein;
   a second branch electrically connected to said terminal and having a second resistance therein;
   a first solid state switching device disposed in said first branch for switching current therein between a first path and a second path, said first switching device having a third resistance that is in series with said first resistance;
   a second solid state switching device disposed in said second branch, said second switching device being biased into a conducting condition for passing current therethrough and having a fourth resistance, said third and fourth resistances having a first ratio and said first and second resistances having a second ratio equal to the first ratio.

2. The attenuator of claim 1 wherein the first solid state switching device comprises:
   a first pair of serially-coupled FETs forming said first path for switching current therethrough when said first pair of FETs is on;
   a second pair of serially-coupled FETs forming said second path for switching current therethrough when said second FET pair is on; and
   means for driving said first and second FET pairs so that when said first pair is on, said second pair is off and vice versa.

3. The attenuator of claim 2 wherein the ratio of said third resistance to said fourth resistance is approximately 2:1 and wherein said second switching device comprises a single FET.

4. The attenuator of claim 3 wherein the gate of the FET in said second switching device is electrically tied to the source thereof.

5. The attenuator of claim 4 wherein the gate-to-source voltage for each of said FETs in said first switching device equals zero when said FETs are on.

6. The attenuator of claim 1 wherein said first switching device comprises:
   a first FET forming said first path for switching current therethrough when said first FET is on;
   a second FET forming said second path for switching current therethrough when said second FET is on; and
   means for driving said first and second FETs so that when said first FET is on, said second FET is off and vice versa.

7. The attenuator of claim 6 wherein the ratio of said third resistance to said fourth resistance is approximately 2:1 and wherein said second switching device comprises a third FET and a fourth FET in parallel with one another.

8. The attenuator of claim 7 wherein said first FET has the same gate-to-source voltage as said third and fourth FETs when said first FET is on and said second FET has the same gate-to-source voltage as said third and fourth FETs when said second FET is on.

9. The attenuator of claim 7 wherein the gates of the FETs in said second switching device are electrically tied to the sources thereof.

10. The attenuator of claim 1 wherein said attenuator has an input impedance equal to said first resistance plus said third resistance.

11. A method for compensating errors due to the resistance of a solid state switching device in an attenuator of the type having first and second coupled branches in which first and second resistances, respectively, for splitting current between the branches inversely proportional to the value of said resistances and further having a solid state switching device disposed in series in said first branch having a third resistance for switching current in said first branch between a first path and a second path, said method comprising the step of providing a fourth resistance in said second branch, said third and fourth resistances having a first ratio and said first and second resistances having a second ratio equal to the first ratio.

12. The method of claim 11 wherein the step of providing an additional resistance in said second branch comprises the step of providing a second solid state switching device disposed in series in said second branch.

13. The method of claim 12 wherein said first solid state switching device comprises a first FET for switching current to said first path when said first FET is on; a second FET for switching current to said second path when said second FET is on; and means for driving said first and second FETs so that when said first FET is on, said second FET is off and vice versa and wherein the step of providing a second solid state switching device disposed in series in said second branch comprises the step of providing a third FET and a fourth FET in parallel with one another.

14. The method of claim 13 wherein said method further comprises the step of tying the gates of the FETs in said second switching device to the sources thereof.

15. A method for attenuating a signal comprising the steps of:
   applying the signal to a circuit thereby generating a flow of current;
   splitting current between:
      a first branch having a first resistance and a first solid state switching device disposed therein; and
      a second branch having a second resistance and a second solid state switching device disposed therein; and
   preselecting the resistances of said first and second solid state switching devices so that a ratio of the resistance of said first switching device to that of said second switching device is substantially equal to a ratio of the resistances of said four resistance to that of said second resistance.

16. The method of claim 15 wherein said first solid state switching device comprises a first FET for switching current in said first branch to a first path when said first FET is on; a second FET for switching current in said first branch to a second path when said second FET is on; and means for driving said first and second FETs so that when said first FET is on, said second FET is off and vice versa and wherein said method further comprises the step of providing a third FET and a fourth FET in parallel with one another in said second branch.

17. The method of claim 15 wherein said method further includes the step of preselecting the values of said first and second resistances and the resistances of said first and second solid state switching devices thereby predetermining the impedance of said circuit.

18. An apparatus comprising:
   a plurality of vertical branches each having a first resistance therein, said resistance having a first end and a second end;
   a horizontal branch connected between the first ends of said first resistances in each pair of adjacent vertical branches;
   a second resistance disposed in each of said second branches;
   a solid state switching device connected to the second end of each first resistance for switching between ground and the input to a summing amplifier, said solid state switching device having a third resistance;
   a fourth resistance disposed in each of said second branches, said third and fourth resistances having a ratio equal to a ratio of said first and second resistances; and
   means for switching adjacent switching devices response to the value of corresponding adjacent bits in a digital word.

19. The apparatus of claim 18 wherein said solid state switching device comprises a first FET for connecting said second end of said first resistance to ground when said first FET is biased on and said second FET is biased off and a second FET for connecting the second end of said first resistance to the input of said summing amplifier when said first FET is biased off and said second FET is biased on.

20. The apparatus of claim 19 wherein the ratio of said third resistance to said fourth resistance is approximately 2:1 and wherein said fourth resistance comprises a third FET and a fourth FET in parallel with one another.

21. The apparatus of claim 20 wherein the gates of said third and fourth FETs are electrically tied to the sources thereof.

22. The apparatus of claim 18 wherein said apparatus is implemented in integrated circuit form.

23. The apparatus of claim 18 wherein said attenuator has an input impedance equal to said first resistance plus said third resistance.

* * * * *

UNITED STATES PATENT AND TRADEMARK OFFICE
CERTIFICATE OF CORRECTION

PATENT NO. : 5,006,735

DATED : April 9, 1991

INVENTOR(S) : Stewart S. Taylor

It is certified that error appears in the above-identified patent and that said Letters Patent is hereby corrected as shown below:

Col. 7, line 21, "saId" should be "said".

Col. 8, line 10, "four" should be "first".

Signed and Sealed this

First Day of December, 1992

*Attest:*

DOUGLAS B. COMER

*Attesting Officer*      *Acting Commissioner of Patents and Trademarks*